United States Patent
Shaw et al.

(10) Patent No.: US 10,028,401 B2
(45) Date of Patent: Jul. 17, 2018

(54) SIDEWALL-ACCESSIBLE DENSE STORAGE RACK

(71) Applicant: Microsoft Technology Licensing, LLC, Redmond, WA (US)

(72) Inventors: Mark Edward Shaw, Sammamish, WA (US); Wilson V. Vu, Seattle, WA (US); Martha Geoghegan Peterson, Woodinville, WA (US); Hien A. Thai, Issaquah, WA (US); Eric C. Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 32 days.

(21) Appl. No.: 14/975,614

(22) Filed: Dec. 18, 2015

(65) Prior Publication Data

US 2017/0181306 A1    Jun. 22, 2017

(51) Int. Cl.
*H05K 5/00* (2006.01)
*H05K 7/10* (2006.01)
(Continued)

(52) U.S. Cl.
CPC ............. *H05K 7/10* (2013.01); *G11B 33/128* (2013.01); *H05K 7/1438* (2013.01);
(Continued)

(58) Field of Classification Search
CPC .... H05K 7/20709; H05K 7/10; H05K 7/1492; G11B 33/128
(Continued)

(56) References Cited

U.S. PATENT DOCUMENTS 5,877,938 A    3/1999    Hobbs et al.
6,129,429 A    10/2000    Hardt et al.
(Continued)

FOREIGN PATENT DOCUMENTS

WO    2011008762 A2    1/2011

OTHER PUBLICATIONS

Terkaly, Bruno, "Why Platform as a Service will rule the world", Published on: Jul. 10, 2012, retrieved from <<http://blogs.msdn.com/b/brunoterkaly/archive/2012/07/10/why-platform-as-a-service-will-rule-the-world.aspx>>, 9 pages.
(Continued)

*Primary Examiner* — Nidhi Thaker
(74) *Attorney, Agent, or Firm* — Liang IP, PLLC

(57) ABSTRACT

Rack configurations provide increased storage device density without compromising cooling or immediate device availability. A device rack has a frame including posts which define an interior containing system board(s) with electronic device connectors. The system board is fixed relative to the frame, and the rack is devoid of sliding rails and cable management arms for the devices, thereby reducing rack weight and mechanical complexity. A vertical plenum within the rack between loaded system boards carries cooling air for the devices and may also permit use of a service robot to install or replace hot-pluggable hard disk drives or other devices, which can be arranged in columns. As one objective measure of the increased density provided, a connector density is at least a specified number of hundreds of mechanically and electronically releasably connectable electronic device connectors per cubic meter within the rack.

11 Claims, 10 Drawing Sheets

(51) Int. Cl.
*H05K 7/20* (2006.01)
*G11B 33/12* (2006.01)
*H05K 7/14* (2006.01)

(52) U.S. Cl.
CPC ......... *H05K 7/1448* (2013.01); *H05K 7/1492* (2013.01); *H05K 7/20709* (2013.01)

(58) Field of Classification Search
USPC ................................................ 361/724–727
See application file for complete search history.

(56) References Cited

U.S. PATENT DOCUMENTS

| | | | |
|---|---|---|---|
| 7,212,470 B2 | 5/2007 | Dimitri et | |
| 7,791,890 B2 * | 9/2010 | Ishida ................ | H05K 7/1492 211/26 |
| 7,929,303 B1 | 4/2011 | Merrow | |
| 8,009,385 B2 * | 8/2011 | Starr ................... | H05K 7/1487 360/98.01 |
| 8,102,173 B2 | 1/2012 | Merrow | |
| 8,387,249 B2 | 3/2013 | Campbell et al. | |
| 8,599,550 B2 * | 12/2013 | Davis .................. | G11B 33/128 361/679.33 |
| 8,687,349 B2 | 4/2014 | Truebenbach | |
| 8,701,737 B2 * | 4/2014 | Mainers ............. | H05K 7/20745 160/1 |
| 8,814,286 B2 | 8/2014 | Ward et al. | |
| 8,868,954 B1 | 10/2014 | Balakrsihnan et al. | |
| 9,019,708 B2 * | 4/2015 | Shinsato ............. | G06F 1/181 361/724 |
| 2002/0118526 A1 | 8/2002 | Fritz et al. | |
| 2002/0144044 A1 | 10/2002 | Moon et al. | |
| 2002/0159182 A1 | 10/2002 | Albrecht et al. | |
| 2002/0196601 A1 | 12/2002 | Lee et al. | |
| 2003/0009700 A1 | 1/2003 | Emberty et al. | |
| 2003/0042096 A1 | 3/2003 | Peterson et al. | |
| 2003/0046452 A1 | 3/2003 | Andrewartha et al. | |
| 2004/0264133 A1 * | 12/2004 | Fukuda ................ | G11B 33/142 361/695 |
| 2005/0111136 A1 | 5/2005 | Miyamoto et al. | |
| 2005/0257232 A1 * | 11/2005 | Hidaka ................ | G11B 33/126 720/654 |
| 2006/0012950 A1 * | 1/2006 | Shih .................... | G06F 1/184 361/679.33 |
| 2006/0077776 A1 | 4/2006 | Matsushima et al. | |
| 2006/0203433 A1 | 9/2006 | Peterson et al. | |
| 2007/0047180 A1 | 3/2007 | Wirtzberger et al. | |
| 2007/0083690 A1 | 4/2007 | Koga et al. | |
| 2007/0115627 A1 * | 5/2007 | Carlisi ................ | G06F 1/183 361/679.01 |
| 2007/0288813 A1 | 12/2007 | Belady et al. | |
| 2008/0055868 A1 | 3/2008 | Peterson et al. | |
| 2008/0165507 A1 | 7/2008 | Belady et al. | |
| 2009/0002934 A1 * | 1/2009 | Carlson ................ | G06F 1/187 361/679.33 |
| 2009/0297328 A1 * | 12/2009 | Slocum, III .......... | B25J 9/0093 414/806 |
| 2010/0064610 A1 | 3/2010 | Kulkarni et al. | |
| 2011/0273840 A1 | 11/2011 | Chen | |
| 2011/0304211 A1 | 12/2011 | Peterson et al. | |
| 2012/0098343 A1 | 4/2012 | Harris et al. | |
| 2012/0323400 A1 | 12/2012 | Sankar et al. | |
| 2013/0050955 A1 * | 2/2013 | Shinsato ................ | G06F 1/181 361/727 |
| 2013/0163185 A1 | 6/2013 | Gilges et al. | |
| 2013/0265725 A1 * | 10/2013 | Harvilchuck .......... | G06F 1/181 361/720 |
| 2013/0282944 A1 | 10/2013 | Shaw et al. | |
| 2013/0295834 A1 | 11/2013 | Faist et al. | |
| 2013/0335907 A1 | 12/2013 | Shaw et al. | |
| 2014/0036452 A1 | 2/2014 | Peterson et al. | |
| 2014/0170865 A1 | 6/2014 | Peterson et al. | |
| 2014/0173157 A1 | 6/2014 | Shaw et al. | |
| 2014/0195859 A1 | 7/2014 | Dickenson et al. | |
| 2015/0029643 A1 | 1/2015 | Peterson et al. | |
| 2015/0032286 A1 | 1/2015 | Balakrishnan et al. | |
| 2015/0077924 A1 | 3/2015 | Rauline | |
| 2015/0120636 A1 | 4/2015 | Gao | |
| 2015/0180234 A1 | 6/2015 | Bailey et al. | |

OTHER PUBLICATIONS

Nelson, et al., "Energy Efficient Datacenters the Role of Modularity in Datacenter Design", In White Papers, Aug. 35, 2015, 58 pages.
"Storage Solutions", retrieved from <<https://www.americandynamics.net/Support/Docs/ad-product-guide-storage-solutions-2010_It_en.pdf>>, 2010, 5 pages.
"NeXtScale System—M4", retrieved from <<http://www.lenovo.com/images/products/system-x/pdfs/datasheets/nextscale_m4_ds.pdf>>, 2014, 4 pages.
"19-inch rack", retrieved from <<https://en.wikipedia.org/wiki/19-inch_rack>>, 11 pages, Aug. 28, 2015.
"Hard disk drive", retrieved from <<https://en.wikipedia.org/wiki/Hard_disk_drive>>, 24 pages, Nov. 10, 2015.
"Hot swapping", retrieved from <<https://en.wikipedia.org/wiki/Hot_swapping>>, 7 pages, Jul. 22, 2015.
"IBM TS3500 Tape Library", retrieved from <<http://www-03.ibm.com/systems/storage/tape/ts3500/>>, 2 pages, no later than Aug. 28, 2015.
"Optical jukebox", retrieved from <<https://en.wikipedia.org/wiki/Optical_jukebox>>, 4 pages, Jun. 19, 2015.
Shobana Balakrishnan, et al., "Pelican: A building block for exascale cold data storage", retrieved from <<http://research.microsoft.com/pubs/230697/osdi2014-Pelican.pdf>>, Oct. 6, 2014, 15 pages.
"Designing SLIDES into Electronic Enclosures", retrieved from <<http://www.chassis-plans.com/PDF/Rack_Slide_Use.pdf>>, 20 pages, 2011.
"Rack System Hardware & Accessories", retrieved from <<http://www.parts-express.com/cat/rack-system-hardware-accessories/614>>, no later than Dec. 2, 2015, 2 pages.
"Tape library", retrieved from <<https://en.wikipedia.org/wiki/Tape_library>>, 3 pages, May 27, 2015.
"International Search Report and Written Opinion Issued in PCT Application No. PCT/US2016/065684", dated Mar. 28, 2017, 14 Pages.
"Second Written Opinion Issued in PCT Application No. PCT/US2016/065684", dated Nov. 10, 2017, 8 Pages.
"International Preliminary Report on Patentability Issued in PCT Application No. PCT/US2016/065684", dated Feb. 28, 2018, 9 Pages.

* cited by examiner

SIDEWALL-ACCESSIBLE DENSE STORAGE RACK

BACKGROUND

Hard disk drives, flash memories, and other electronic components are sometimes mounted on printed circuit boards which are in turn placed in trays, in a chassis, or in other arrangements, and then mounted in a rack. Provisions are made for cooling the mounted components, e.g., by circulating cooling air against them. Provisions are also made for physically accessing mounted components, e.g., by attaching component boards to sliding rails that can be moved to bring the components outside the rack. Hinged cable management arms are sometimes used in connection with such sliding rails, to permit continued power and signal connectivity while a component board slides along the rails.

SUMMARY

Some embodiments are directed to the technical activity of increasing device density within a rack or array of racks while still allowing airflow to cool most or all of the electronic components within the rack(s). Some embodiments are directed to the related technical activity of servicing a storage rack, e.g., by connecting and/or disconnecting individual storage devices without powering down or off-lining other storage devices in the same rack. Other technical activities pertinent to teachings herein will also become apparent to those of skill in the art.

Some embodiments provide a device rack which has a rack frame including posts whose exterior surfaces define a rack frame interior. At least one system board is located at least partially within the rack frame interior. A plurality of electronic device connectors are mounted on the system board(s), such as hard disk drive connectors. Each connector has an electronic device portion which is mechanically and electronically releasably connectable to at least one electronic device. In some embodiments, the system board is fixed in position relative to the posts, as opposed for instance to being attached to sliding rails. In some embodiments, the rack frame interior is also devoid of any hinged cable management arms. In some embodiments, a plenum within the rack frame interior is defined at least in part by adjacent electronic devices and connectors, and by at least one system board adjacent to the plenum. The plenum may carry cooling air and/or the plenum may be sized and shaped to permit movement of a robot and gripped drive through the plenum to install or replace hard disk drives.

In some embodiments, a robot services the rack by connecting and/or disconnecting electronic devices such as hard disk drives, without necessarily moving the connectors themselves. The robot and a drive gripped by the robot may move through a plenum within the rack, and/or near an exterior sidewall of the rack. The hard disk drives may be hot-pluggable. The drives may be arranged in one or more vertical columns. Some embodiments provide a connector density within the rack frame interior that is at least a specified number of hundreds of mechanically and electronically releasably connectable electronic device connectors per cubic meter.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

DETAILED DESCRIPTION

Acronyms

Figure 1:
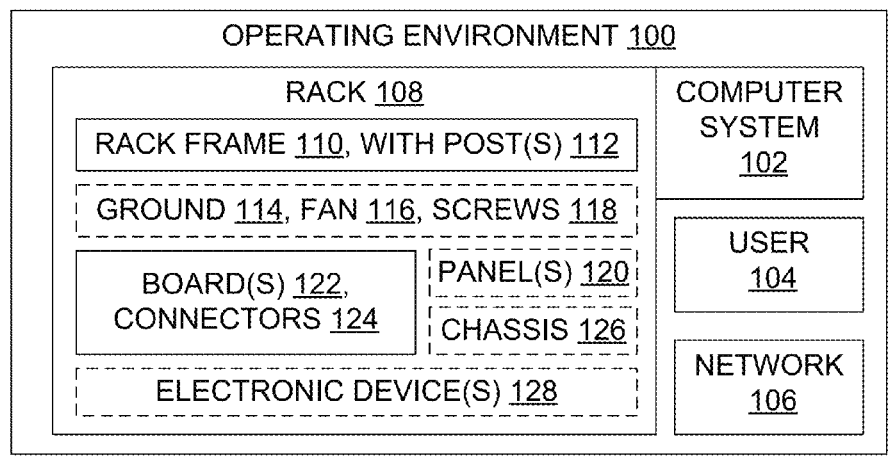
FIG. 1 is a block diagram illustrating a rack and some associated hardware.

Some acronyms are defined below, but others may be defined elsewhere herein or require no definition to be understood by one of skill.

CAPEX: capital expense, capital expenditure
CD: compact disc
DVD: digital versatile disk or digital video disc
HDD: hard disk drive
JBOD: just a bunch of disks, as opposed, e.g., to RAID
OPEX: operating expense, operating costs
PCB: printed circuit board
RAID: redundant array of independent disks
RAM: random access memory
ROM: read only memory Overview Some storage solutions incorporate a high-density concentration of hard disk drives (HDDs) to drive up efficiency and drive down overall costs. But systems developers have been required to choose between mechanically simple cold-repair, where large chunks of HDDs are taken off-line to repair a single HDD, or expensive and mechanically complex hot-repair solutions where a single HDD is replaced. Some solutions have hot-pluggable drives, but are less dense than cooling requirements and/or power capabilities alone would permit. The decreased density arises, e.g., from use of complicated mechanical contraptions such as sliding rails, pullout trays with heavy duty hinges, and/or arms etc. for cable management. Such a solution is relatively expensive, heavy, and less dense, with relatively high overhead cost, and it is not easily serviceable. Some other solutions involves non-hot-pluggable drives. These could be as dense as cooling and power capabilities permit, but the drives are not hot-pluggable so the fault domains are much larger than a single drive. If a drive fails, it causes a large subset of the system or the entire system (which may include hundreds of drives) to go down to allow repair or replacement of the failed drive.

Some embodiments herein provide a storage solution which includes a high-density concentration of HDDs that is mechanically simple and allows repair of a single HDD (i.e., hot-repair). Such a system saves storage OPEX and CAPEX cost. It allows fault domains to be designed with finer granularity and to align with a more optimal footprint. Such a solution can provide density similar to or better than today's systems to promote cost savings in datacenters.

The technical character of embodiments described herein will be apparent to one of ordinary skill in the art, and will also be apparent in several ways to a wide range of attentive readers. For instance, some embodiments address technical challenges such as tradeoffs between cooling requirements, service domain size in the event of a failure, and device density.

Reference is made herein to exemplary embodiments such as those illustrated in the drawings, and specific language is used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

Terminology

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise their right to their own lexicography. Quoted terms are being defined explicitly, but a term may also be defined implicitly without using quotation marks. Terms may be defined, either explicitly or implicitly, here in the Detailed Description and/or elsewhere in the application file.

Although distinctions can be made between rigid printed circuit boards, wire-wrap boards, printed electronics, and organic electronics, for convenience the term "PCB" is used broadly herein to cover them all. Unless otherwise stated, the terms "board" and "system board" each refer to a PCB. A "system board" is a board that has a plurality of connectors for mechanically and electronically releasably connecting electronic devices to the circuitry of the board.

Some of the many examples of "electronic devices" as that term is used most broadly herein include semiconductors (processors, memory, and others), storage devices (magnetic disks, optical disks, tape drives, solid state devices, and others), display devices (light emitting diodes, liquid crystal displays, and others), electromechanical devices (relays, solenoids, piezoelectrics, and others), oscillators, crystals, amplifiers, resistors, capacitors, transformers, transducers, modulators, analog-to-digital converters, sensors, integrated circuits, various analog and/or digital circuits, as well as associated buses, heat sinks, traces, vias, and other circuitry. An electronic device may be composed of other electronic devices, e.g., a hard disk drive may be composed of electromechanical devices, semiconductors, resistors, capacitors, and other electronic devices.

Unless expressly stated otherwise in a claim, however, the connectable electronic devices of interest in the claims are individually mechanically and electronically releasably connected to a PCB. So a resistor soldered to a PCB is an electronic device is the broadest sense, but is outside the scope of electronic devices covered by a claim because a soldered connection is not mechanically releasable; it is instead mechanically fixed in that it must be broken to disconnect the resistor. Likewise, a glued connection is not mechanically releasable. A "mechanically releasable" connection is one that can be engaged or disengaged by spatial movements without breaking an adhesive bond or a soldered bond.

Connectors and electronic devices may be "mechanically secured" to a board using surface mount technology, in-place printing, or another technology which mechanically attaches the electronic components to the board. A mechanically secured item is not necessarily mechanically releasable; items soldered or glued to a board are mechanically secured but not mechanically releasable. On the other hand, a hard disk drive plugged into a connector is typically both mechanically secured and mechanically releasable.

As used herein, a "computer system" may include, for example, one or more servers, motherboards, other printed circuit boards, processing nodes, laptop computers, tablets, personal computers (portable or not), personal digital assistants, smartphones, smartwatches, smartbands, cell or mobile phones, other mobile devices having at least a processor and a memory, and/or other device(s) providing one or more processors controlled at least in part by instructions. The instructions may be in the form of firmware or other software in memory and/or specialized circuitry. A "multithreaded" computer system is a computer system which supports multiple execution threads. The term "thread" should be understood to include any code capable of or subject to scheduling and/or synchronization.

A "logical processor" or "processor" is a single independent hardware thread-processing unit, such as a core in a simultaneous multithreading implementation. As another example, a hyperthreaded quad core chip running two threads per core has eight logical processors. A logical processor includes hardware. The term "logical" is used to prevent a mistaken conclusion that a given chip has at most one processor; "logical processor" and "processor" are used interchangeably herein. Processors may be general purpose, or they may be tailored for specific uses such as graphics processing, signal processing, floating-point arithmetic processing, encryption, I/O processing, and so on.

A "multiprocessor" computer system is a computer system which has multiple logical processors. Multiprocessor environments occur in various configurations. In a given configuration, all of the processors may be functionally equal, whereas in another configuration some processors may differ from other processors by virtue of having different hardware capabilities, different software assignments, or both. Depending on the configuration, processors may be tightly coupled to each other on a single bus, or they may be loosely coupled. In some configurations the processors share a central memory, in some they each have their own local memory, and in some configurations both shared and local memories are present.

"Code" means processor instructions, data (which includes constants, variables, and data structures), or both instructions and data. Some examples include applications, kernels, drivers, interrupt handlers, firmware, state machines, libraries, functions, procedures, controller portions implemented in software, exception handlers, operating systems, hypervisors, and virtual machines.

as used herein, "include" allows additional elements (i.e., includes means comprises) unless otherwise stated. "Consists of" means consists essentially of, or consists entirely of. X consists essentially of Y when the non-Y part of X, if any, can be freely altered, removed, and/or added without altering the functionality of claimed embodiments so far as a claim in question is concerned.

"Process" is sometimes used as a term of the computing science arts, and in that technical sense encompasses resource users, namely, coroutines, threads, tasks, interrupt handlers, application processes, kernel processes, procedures, and object methods, for example. "Process" is also used herein as a patent law term of art, e.g., in describing a process claim as opposed to a system claim. Similarly, "method" may be used at times as a technical term in the computing science arts and also be used as a patent law term of art (a process). Those of skill will understand which meaning is intended in a particular instance, and will also understand that a given claimed process or method (in the patent law sense) may sometimes be implemented using one or more processes or methods (in the computing science sense).

Throughout this document, use of the optional plural "(s)", "(es)", or "(ies)" means that one or more of the indicated feature is present. For example, "board(s)" means "one or more boards" or equivalently "at least one board".

For the purposes of United States law and practice, use of the word "step" herein, in the claims or elsewhere, is not intended to invoke means-plus-function, step-plus-function, or 35 United State Code Section 112 Sixth Paragraph/Section 112(f) claim interpretation. Any presumption to that effect is hereby explicitly rebutted. Claim language intended to be interpreted as means-plus-function language, if any, will expressly recite that intention.

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party of interest such as connecting, cooling, directing, disconnecting, gripping, including, moving, performing, placing, positioning, powering, providing, pulling, pushing, servicing, stationing, supporting, using, (and connects, connected, cools, cooled, etc.) with regard to a destination or other subject may involve intervening action by some other party, yet still be understood as being performed directly by the party of interest.

Whenever reference is made to data or instructions, it is understood that these items configure a computer-readable memory and/or computer-readable storage medium, thereby transforming it to a particular article, as opposed to simply existing on paper, in a person's mind, or as a mere signal being propagated on a wire, for example. No claim covers a signal per se, an abstract idea per se, or a natural phenomenon per se.

An "embodiment" herein is an example. The term "embodiment" is not interchangeable with "the invention". Embodiments may freely share or borrow aspects to create other embodiments (provided the result is operable), even if a resulting aspect combination is not explicitly described per se herein. Requiring each and every permitted combination to be explicitly described is unnecessary for one of skill in the art, and would be contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination would be contrary to policies calling for patent specifications to be concise and for readers to be knowledgeable in the technical fields concerned.

Some terms herein are defined in terms of measured values, and more than one cutoff is given, potentially resulting in multiple definitions. Particular values are specified in particular claims. But in the event it is not clear to the designated person of ordinary skill in the art which definition applies, then the definition which appears first in the present application as filed should be used.

Operating Environments

An operating environment 100 for an embodiment may include a server farm, data center, or other facility having one or more computer systems 102 (possibly including storage devices). A computer system may be a multiprocessor computer system, or not. An operating environment 100 may include one or more machines in a given computer system 102, which may be clustered, client-server networked, and/or peer-to-peer networked. An individual server or other computing machine is a computer system, and a group of cooperating machines is also a computer system.

Human users 104 may interact with the computer system 102 by using displays, keyboards, and other peripherals, via typed text, touch, voice, movement, computer vision, gestures, and/or other forms of I/O. A user interface may support interaction between an embodiment and one or more human users. A user interface may include a command line interface, a graphical user interface, natural user interface (gesture recognition, head and eye tracking, motion gesture detection, etc.), voice command interface, augmented reality interface, virtual reality interface, and/or other interface presentations. A given operating environment includes devices and infrastructure (power, network 106, fans, etc.) which support these different options and uses.

System administrators, developers, engineers, and end-users are each a particular type of user 104. Automated agents, scripts, playback software, and the like acting on behalf of one or more people may also be users. Storage devices and/or networking devices may be considered peripheral equipment in some embodiments. An embodiment may be deeply embedded in a technical system such that no human user interacts directly with the embodiment. Other computer systems may interact in with the computer system using one or more connections to a network 106 via network interface equipment, for example. Some embodiments operate in a "cloud" computing environment and/or a "cloud" storage environment in which computing services are not owned by their end user but are provided on demand.

A computer system 102 includes at least one logical processor. The computer system also includes one or more computer-readable storage media. Media may be of different physical types. The media may be volatile memory, non-volatile memory, disks (magnetic, optical, or otherwise), fixed in place media, removable media, magnetic media, optical media, solid-state media, and/or of other types of physical durable storage media (as opposed to merely a propagated signal). In particular, a configured medium such as a portable (i.e., external) hard drive, CD, DVD, memory stick, or other removable non-volatile memory medium may become functionally a technological part of the computer system when inserted or otherwise installed, making its content accessible for interaction with and use by processor. The removable configured medium is an example of a computer-readable storage medium. Some other examples of computer-readable storage media include built-in RAM, flash memory, EEPROMS or other ROMs, hard disks, and other memory storage devices which are not readily removable by users. For compliance with current United States patent requirements, neither a computer-readable medium nor a computer-readable storage medium nor a computer-readable memory is a signal per se in any United States application based on the present disclosure.

In some embodiments, a computer system 102 includes multiple computers connected by a network 106. Networking interface equipment can provide access to networks using components such as a packet-switched network interface card, a wireless transceiver, or a telephone network interface, for example, which may be present in a given computer system. However, an embodiment may also communicate through direct memory access, removable non-volatile media, or other information storage-retrieval and/or transmission approaches, or an embodiment may operate in a computer system without communicating with other computer systems.

In addition to processors (e.g., central processing units, arithmetic and logic units, floating point processing units, and/or graphical processing units), memory/storage media 16, display(s), and battery(ies), an operating environment may also include other hardware, such as dual inline memory modules, heat sinks, buses, power supplies, wired and wireless network interface cards, and accelerators, for instance, whose respective operations are described herein to the extent not already apparent to one of skill. Cooling mechanisms may be present, such as air conditioning condensers, fans, raised flooring, thermostats, and ventilation ducts. Sensors may be placed inside or near a system to measure temperature, airflow rate, humidity, and/or other environmental variables. Power sources are typically present, but not necessarily local. Some examples include connections to a power grid, generators (e.g., diesel-powered, solar, wind, geothermal systems), batteries, and uninterruptible power supplies.

In particular, a computer system 102 and/or another part of the operating environment may include one or more racks 108. Each rack 108 includes a rack frame 110. A rack frame 110 includes one or more posts 112. Posts 112 may be formed of steel, other metals, carbon fiber composites, and/or other materials. Posts 112 may be oriented vertically, horizontally, or otherwise. Many conventional rack frames include four vertical posts arranged to define a rectangular volume. Some rack frames include only two parallel vertical posts, from which horizontal struts extend. A given rack frame may be viewed as also including electrical grounds 114, cooling fans 116, bolts or screws 118 for securing items to the posts, housing panels 120, and/or other hardware. Alternately, one or more of the items 114, 116, 118, 120 may be viewed as accessories rather than as part of the rack frame. Unless expressly stated otherwise, electrical grounds 114, cooling fans 116, bolts or screws 118, and housing panels 120 are considered accessories herein, rather than being viewed as inherent or necessary parts of a rack frame. One or more posts 112, by contrast, are considered to be part of a given rack frame 110 unless expressly excluded.

Similarly, for present purposes a rack 108 herein is understood to include one or more system boards 122 (with connectors 124) unless all such boards are expressly excluded. A system board 122 includes a PCB as defined above, to which a plurality of electronic device connectors are mechanically secured. Boards 122 may be mounted in a chassis 126, which may in turn be mounted in a rack 108. However, system boards 122 may also be mounted directly to a rack frame without using a chassis. Electronic devices 128 may be releasably connected to respective connectors 124, but mechanically releasable electronic devices are not part of a given rack 108 unless they are expressly included in the claim or other pertinent description of the rack in question.

One of skill will appreciate that the foregoing aspects and other aspects presented herein under "Operating Environments" may also form part of a given embodiment. This document's headings are not intended to provide a strict classification of features into embodiment and non-embodiment feature classes. One or more items are shown in outline form in the Figures to emphasize that they are not necessarily part of the illustrated operating environment or all embodiments, but may interoperate with items in the operating environment or some embodiments as discussed herein. It does not follow that items not in outline form are necessarily required, in any Figure or any embodiment. In particular, FIG. 1 is provided for convenience; inclusion of an item in FIG. 1 does not imply that the item, or the described use of the item, was known prior to the current innovations.

Example Racks and Rack Frames

Figure 2:
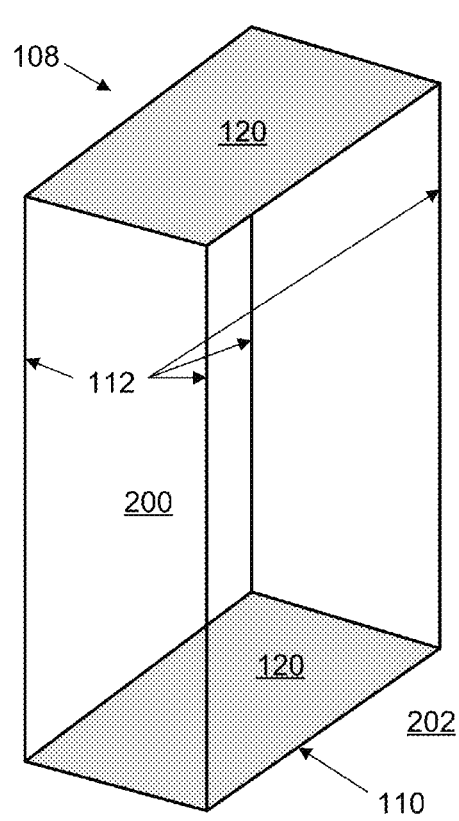
FIG. 2 is a perspective view diagram illustrating an open rack frame.
Figure 3:
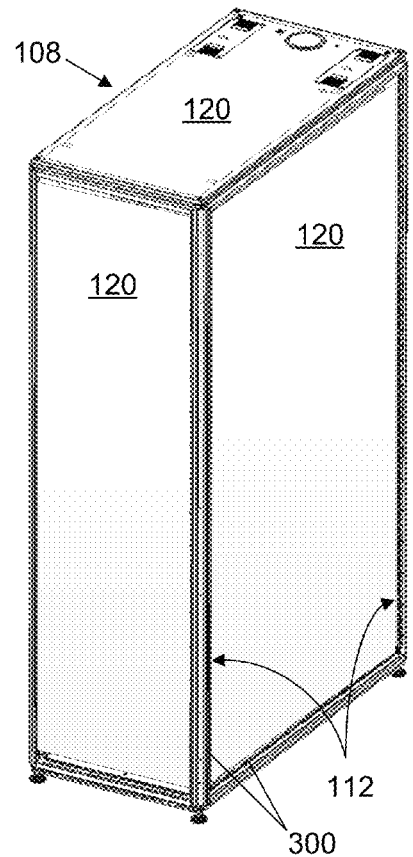
FIG. 3 is a perspective view illustrating a closed rack frame.

FIG. 2 illustrates an open rack frame 110. Posts 112 and panels 120 collectively define a rack frame interior 200, namely, a three-dimensional region bounded by the posts and by actual panels or geometric planes between the posts. In practice, posts 112 are not lines but instead have thickness. As such they have surfaces 300, as illustrated in FIG. 3. For clarity, the rack frame interior 200 is defined herein as a geometric volume enclosed by the geometric planes tangent to the exterior surfaces 300 of the rack frame posts 112. A rack frame exterior 202 is the region outside the rack frame interior 200.

Figure 4:
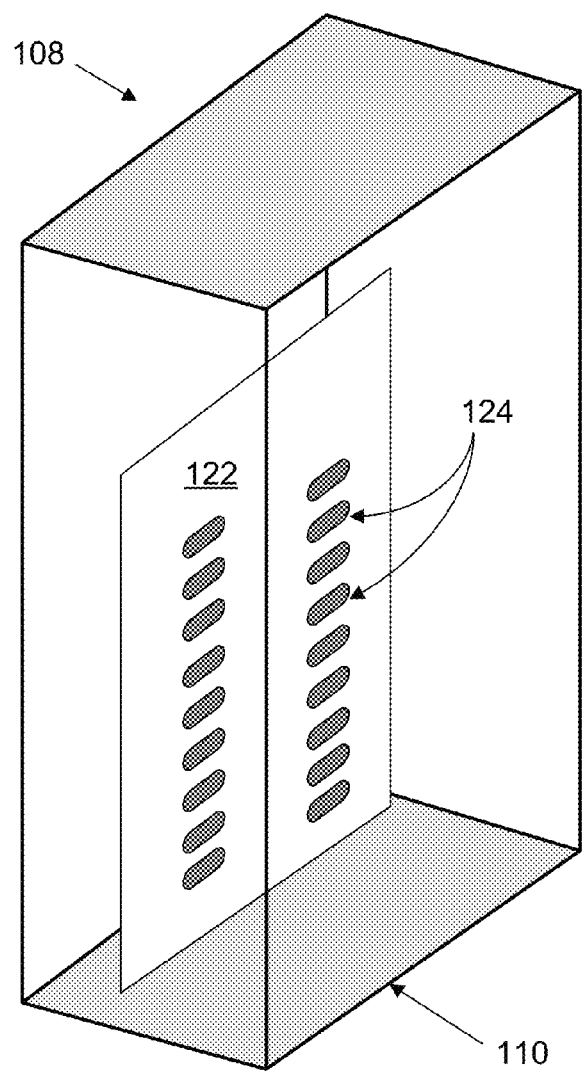
FIG. 4 is a perspective view diagram illustrating a system board and connectors positioned within a rack frame interior.

FIG. 4 illustrates a system board 122 and connectors 124 positioned within a rack frame interior. In practice, in most if not all implementations the connectors 124 are directly mechanically secured to the board 122, and the board is directly or indirectly mechanically secured to the rack frame 110. The securements may be accomplished using screws, bolts, additional connectors, and/or other familiar mechanisms to secure an item in position in space relative to another item.

Figure 5:
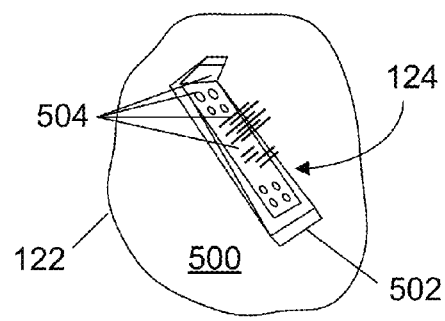
FIG. 5 is a diagram illustrating a generic electronic connector secured to a system board.

FIG. 5 illustrates a generic electronic connector 124 secured to a connector surface 500 system board 122. The connector 124 has a system board portion 502 and an electronic device portion 504. The illustrated connector is generic in that it is not intended to precisely depict any particular connector but instead illustrates aspects of connectors, e.g., pins for electrical connectivity, sockets to receive such pins, and mechanical attachments such as clips or snaps. A given connector in an implementation may have one or more of these aspects, e.g., it may be all male, all female, or a mixture, and it may have zero or more ridges, deformable clips, or other mechanical attachments.

Figure 6:
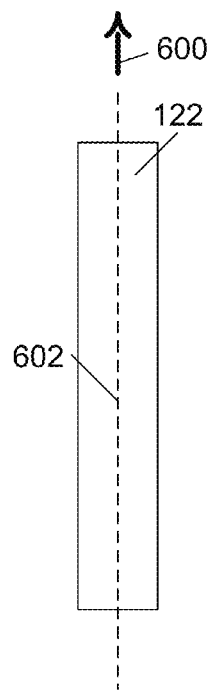
FIGS. 6, 7, and 8 illustrate system board positions relative to vertical.
Figure 7:
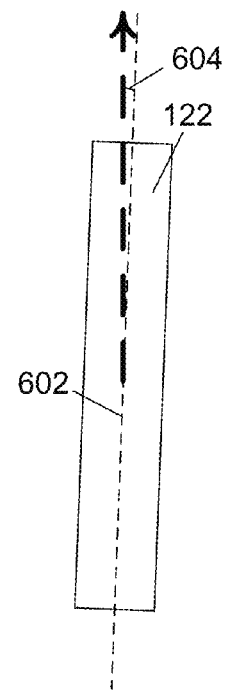
Figure 8:
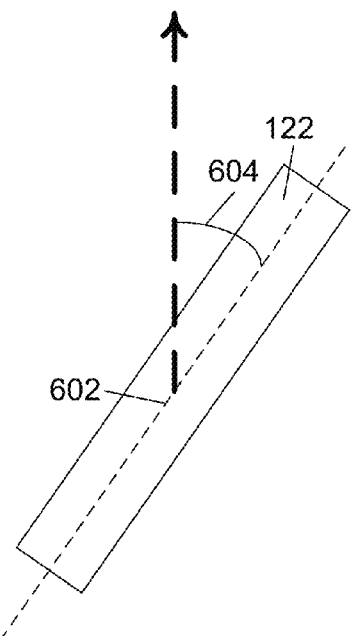

FIGS. 6, 7, and 8 illustrate system board positions relative to vertical. Vertical is indicated in the Figures by a bold dashed arrow 600. A geometric plane 602 bisects a system board 122; the board 122 here includes any connectors and all components that are soldered or glued to the board, although for clarity of illustration they are not shown. The plane 602 and the vertical arrow 600 are at some angle 604 to one another. As examples, in FIG. 6, the board is perfectly vertical and the angle 604 is zero. In FIG. 7, the board is nearly vertical and the angle 604 is under five degrees. In FIG. 8, the board is not close to vertical and the angle 604 is over ten degrees. Those of skill will understand that the board 122 is a physical tangible item, whereas the plane 602 and the angle 604 (like the vertical arrow and vectors also discussed herein) are geometric constructs used for definitional purposes and as geometric constructs they are not physical tangible items.

Figure 9:
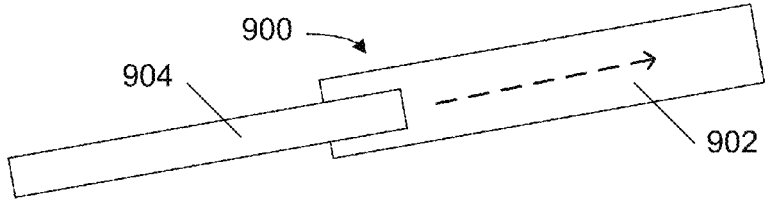
FIG. 9 illustrates a sliding rail in three positions.
Figure 9:
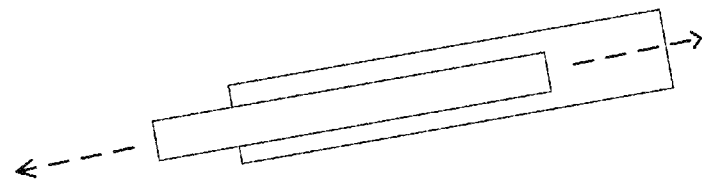
Figure 9:
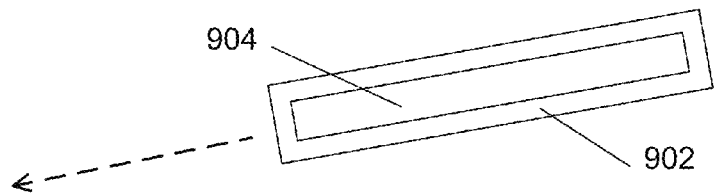

FIG. 9 illustrates a sliding rail 900 in three positions. The rail 900 includes a base 902 and an arm 904. In practice, the base 902 would be secured directly or indirectly to a rack frame, and a PCB would be secured directly or indirectly to the arm, so that service personnel can access PCB components by extending the arm. After servicing, the arm would be retracted, thereby bringing the PCB back to a resting position inside the rack frame. In FIG. 9, the top diagram shows the arm 904 fully extended, the middle diagram shows the arm 904 partially extended (or, one may also say, partially retracted), and the bottom diagram shows the arm 904 fully retracted. Dashed arrows in these diagrams indicate the available direction(s) of travel for the arm 904. For clarity of illustration, the PCB and rack frame are not shown.

Figure 10:
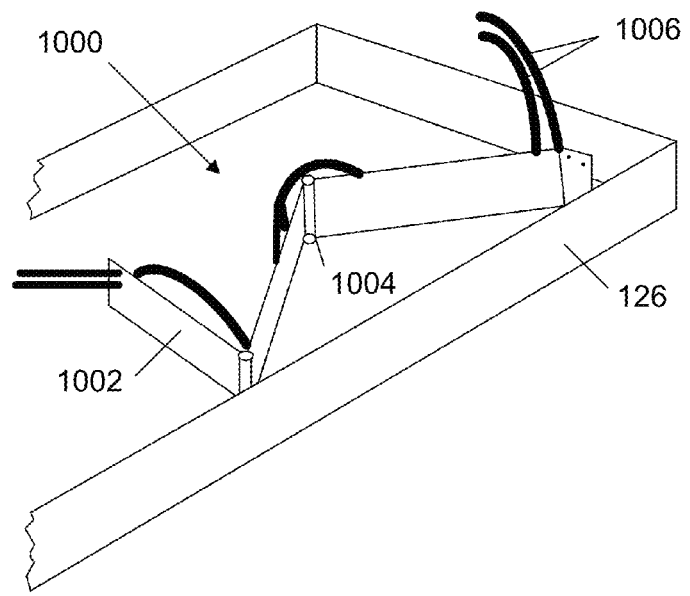
FIG. 10 illustrates a cable management arm.

FIG. 10 illustrates a cable management arm 1000. The arm 1000 includes three sections 1002 connected by hinges 1004. Cables 1006 are secured to the arm 1000. The arm 1000 is secured to a chassis 126, but could also be secured directly to a rack frame. The arm 1000 is an example of a cable management device. A spring-loaded spool (not shown) on which cable 1006 is rolled is another example of a cable management device. Cable management devices operate to extend a cable to maintain an electrical connection to an electronic device as the electronic device is moved out of a rack frame, and to retract the cable and help prevent the cable from tangling or snagging as the electronic device is moved back into the rack frame.

Figure 11:
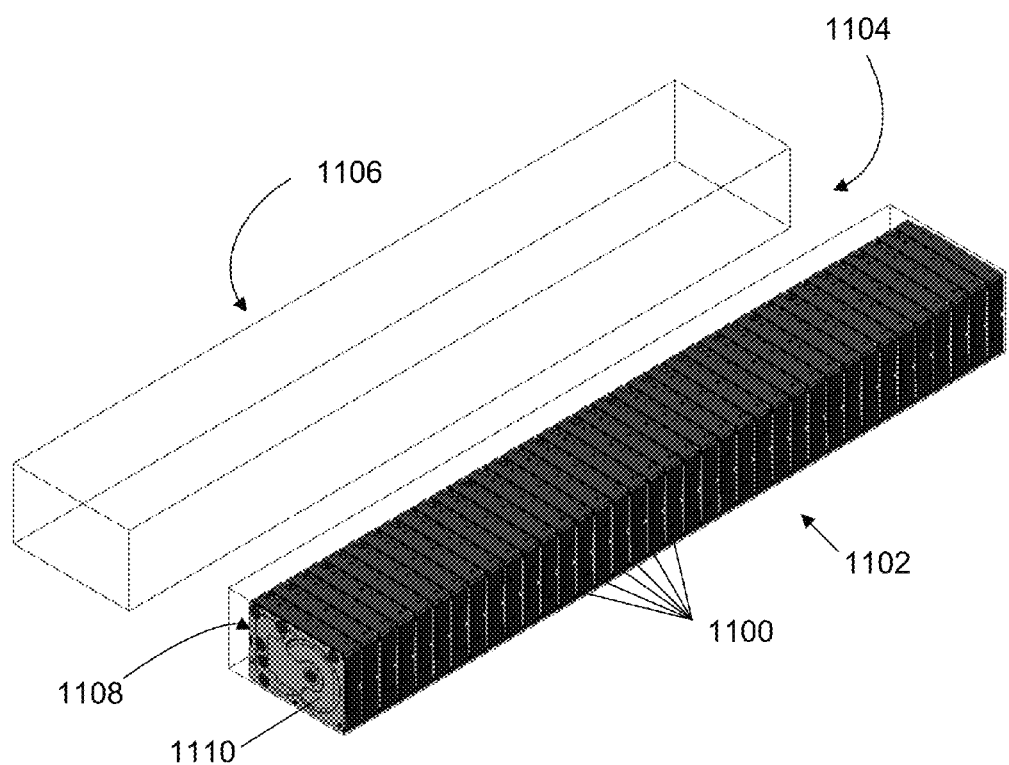
FIG. 11 illustrates a layered arrangement for hard disk drives.

FIG. 11 illustrates a layered arrangement for hard disk drives 1100. Hard disk drives 1100 are an example of electronic devices 128 that can be mechanically and electronically secured to a system board 122 in a releasable manner. In some embodiments, drives 1100 are plugged into a system board (not shown in this Figure), in a row 1102. An additional row, indicated in wireframe in the Figure, may be positioned with an intervening space 1104, to form a layer 1106. Multiple layers 1106 may be formed within a rack, as illustrated for example in FIG. 12, with row spaces combined to form a plenum 1202.

Although FIG. 11 shows a particular orientation of the drives 1100, namely, vertical platters 1110 with end connectors 1108 pointing to the left, drives and other electronic devices 128 may be positioned in layers 1106 with other orientations in some embodiments, e.g., with horizontal platters and/or end connectors pointing to the right, or with a mixture of orientations. Also, a given layer may include one, two, three, or more rows of electronic devices. FIGS. 18 through 22 illustrate some layer 1106 cross-sections with various hard drive sizes, various numbers of drive rows, various numbers of intervening spaces (for use by a robot or otherwise) between drive rows, and various interleaving sequences for drive rows and the intervening or adjacent spaces in a rack.

Figure 12:
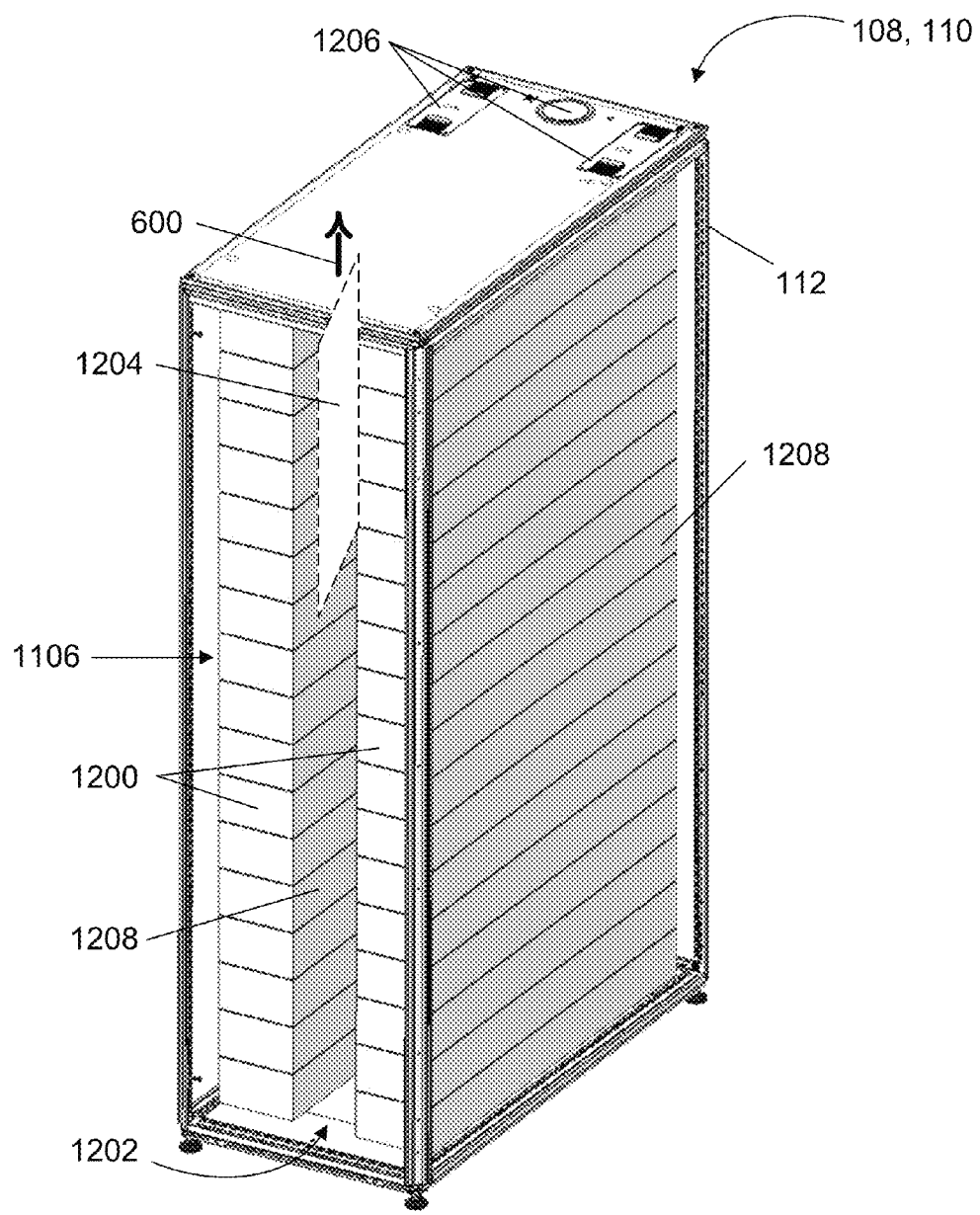
FIG. 12 is a perspective view illustrating a rack frame loaded with hard disk drives layered in an arrangement that forms two columns and a vertical plenum.

FIG. 12 illustrates a rack frame loaded with hard disk drives and/or other electronic devices 128 layered in an arrangement that forms two columns 1200 and a vertical plenum 1202. The plenum 1202 is formed from the vertically aligned spaces 1104 between the vertically aligned rows of devices in the layers. The verticality of the plenum can be assessed by comparing a geometric plane 1204 that bisects the plenum 1202 to a vertical arrow 600. The illustrated rack includes accessory hardware 1206, e.g., electrical ground connections, panels, fan exhausts, which may or may not be present in a given embodiment. The vertically aligned layers define an exterior-facing sidewall 1208 at the right of FIG. 12. An interior-facing sidewall, also designated as a sidewall 1208, is also visible near the center of FIG. 12. The "side" in sidewall refers to the side of a column 1200 of devices 128, not to the side of a rack.

Depending on the embodiment, one or more system boards 122 (not shown) may be located along the exterior-facing sidewall or be located along an interior-facing (e.g., plenum-facing sidewall. Depending on the embodiment, when the system boards are located along an exterior-facing sidewall the pluggable devices 128 travel in the plenum to be connected and disconnected, whereas when the system boards are located along an interior-facing sidewall the pluggable devices travel a space between two racks 108 to be connected and disconnected.

Figure 13:
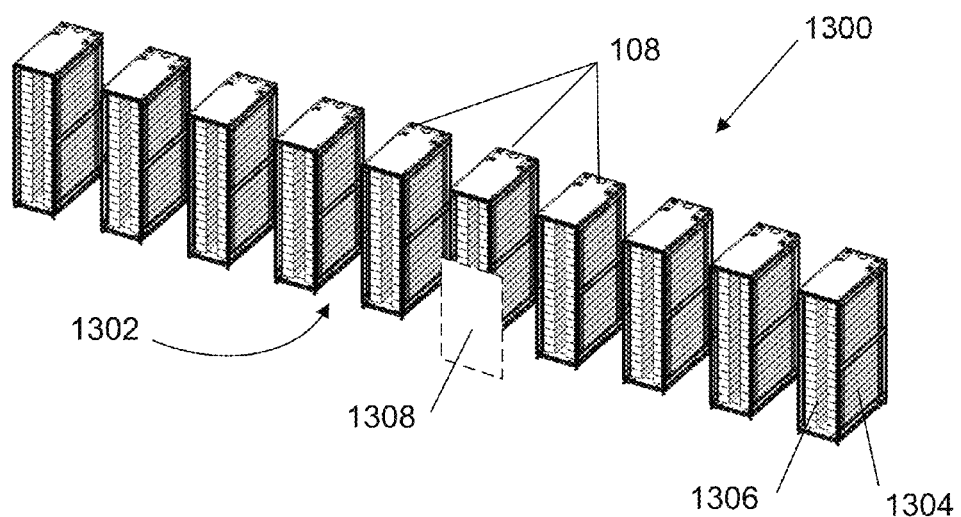
FIG. 13 is a perspective view illustrating an array of loaded racks spaced for human-performed servicing.

FIG. 13 illustrates an array 1300 of loaded racks 108 spaced apart by gaps 1302 for human-performed servicing. Robots may also provide servicing within the gaps 1302. The gaps are bordered by the sides 1304 of the racks 108.

The racks also have fronts 1306. The fronts of the racks are aligned with a geometric plane 1308 through the front of a reference rack.

Figure 14:
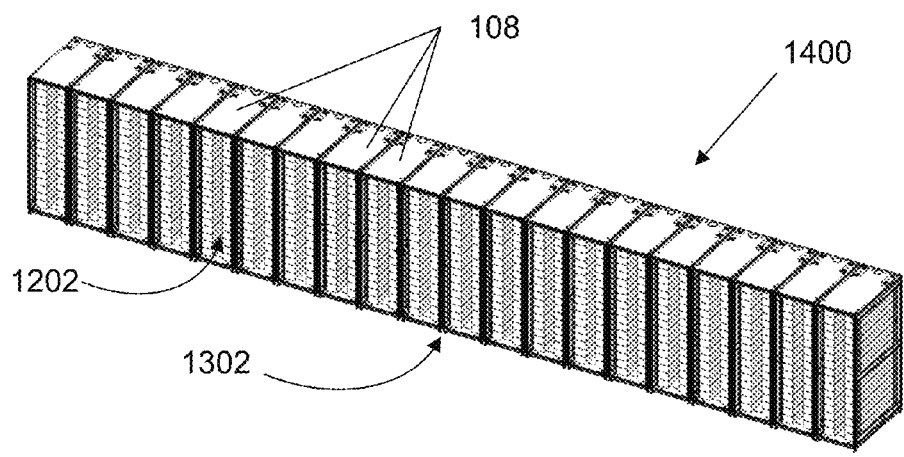
FIG. 14 is a perspective view illustrating an array of loaded racks spaced for robot-performed servicing.

FIG. 14 illustrates an array 1400 of loaded racks 108 spaced more closely together than in FIG. 13, that is, with smaller gaps 1302. Detailed examples are discussed elsewhere herein. In the array 1400, the racks are spaced for robot-performed servicing using robots within the interior plenum 1202 of each rack. Servicing space between the racks 108 is not included in this embodiment.

Figure 15:
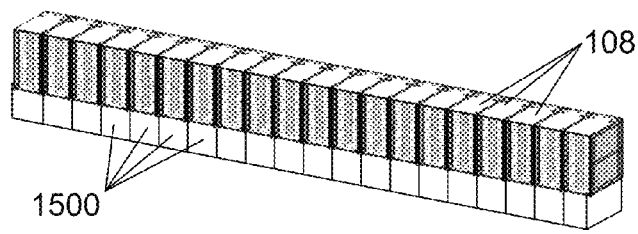
FIG. 15 is a perspective view illustrating an array of loaded racks spaced for robot-performed servicing, with the array positioned above corresponding server heads.

FIG. 15 illustrates an array of loaded rack positioned above corresponding server heads 1500. Although the array illustrated in FIG. 15 has a between-rack spacing 1302 similar to an array 1400 of racks configured for robotic in-plenum servicing, a looser spacing 1302 like that in FIG. 13 array 1300 could also be used. In either case, and in mixed cases, the rack frames 110 sit atop (or in other embodiments, underneath) one or more respective server heads 1500. In a row, in some embodiments, cold air comes in at the rack sides and exhausts to the center and up by using a hot aisle containment mechanism. In some configurations, racks 108 are on top as shown in FIG. 15, while in other configurations, the racks 108 are on the bottom. Some configurations put rows of HDDs front to back, and exhaust up the top. In many, a sufficiently cooling airflow rate is very, very low, and thus easy to accomplish.

Figure 16:
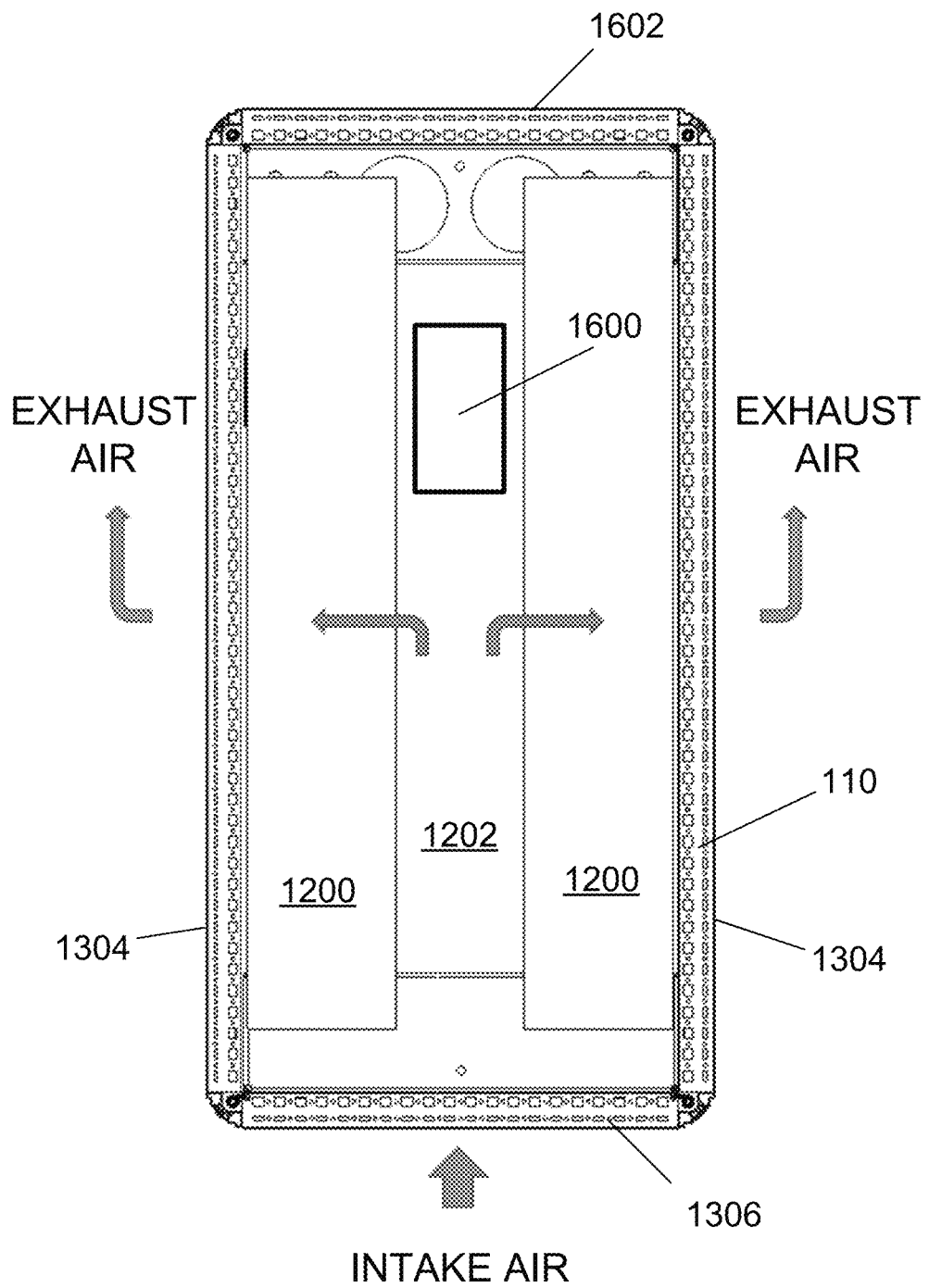
FIG. 16 is a top-down view of a loaded rack with an internal plenum that is used both for cooling airflow and for robot-performed servicing.

FIG. 16 is a top-down view of a loaded rack with an internal plenum 1202 that is used both for cooling airflow and for servicing performed by a robot 1600. Cool air enters the front 1306 of the rack (bottom of FIG. 16), flows across and through the columns 1200 of devices 128, and exits as warmed exhaust air through the sides 1304 of the rack. Fans 116 could be in a chassis or they could be in the hot aisle or elsewhere in the datacenter.

Figure 17:
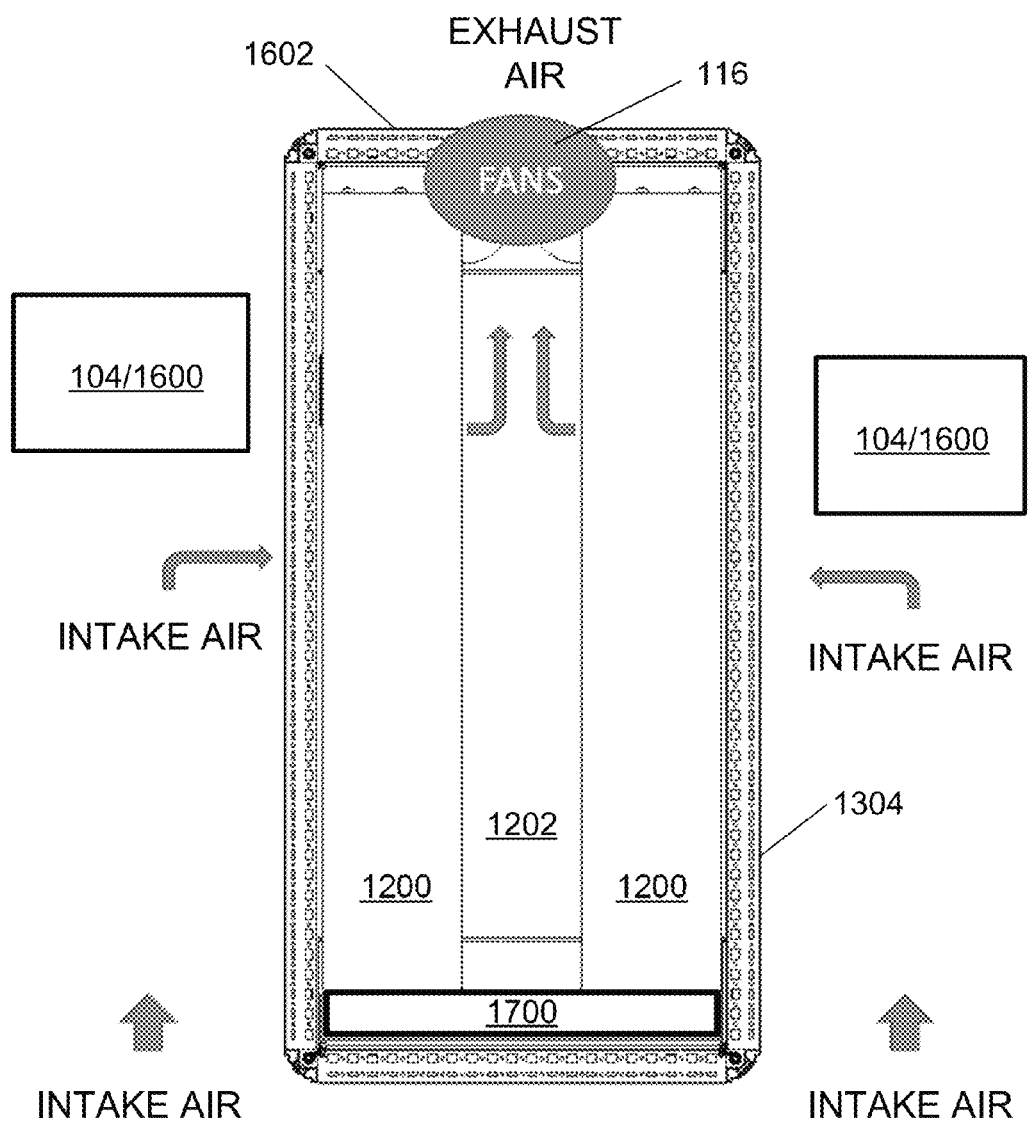
FIG. 17 is a top-down view of a loaded rack with an internal plenum that is used for cooling airflow, and in which servicing is performed by human and/or robotic action near exterior sidewalls.

FIG. 17 is a top-down view of a loaded rack with an internal plenum 1202 that is used for cooling airflow, and in which servicing is performed by human 104 and/or robotic 1600 action near exterior sidewalls. A panel or other airflow blocker 1700 is positioned at the front (bottom of the Figure) of the rack. Cooling air enters the rack through its sides 1304 and exits through the rear 1602 after flowing over devices 128 in the columns 1200. A configuration like that in FIG. 17 can be used, e.g., in a human-serviceable system, wherein HDDs are serviced from the sides of the rack. A center plenum is used for airflow, with vertical row of fans in the rear. Fans can be in the back of the rack assembly, on a panel door, in the facility hot aisle, or configured as datacenter blowers, for example.

FIGS. 18 through 22 illustrate space allocations in a 19" rack form factor for some layer cross-sections with various hard drive 1100 sizes, various numbers of drive 1100 rows, various numbers of intervening spaces 1202, 1800 (for use by a robot 1600 or otherwise) between drive rows, and various interleaving sequences for drive rows and the intervening or adjacent spaces 1800 in a rack. Although arrangements in a 19 inch rack are illustrated, one of skill will understand that racks with other widths may also be implemented using the teachings herein, including 23 inch racks and other racks.

A plenum 1202 is a space 1800 designated for use by a servicing robot and/or designated for cooling air flow. Other spaces 1800 which are not used for servicing or cooling may also be present inside a rack.

In viewing these Figures, one of skill will understand that a given space is not necessarily always occupied by the indicated item, e.g., a service robot may or may not be in an allocated plenum space at a given moment, and a space allocated for a hard drive may or may not be occupied by a drive at a given moment. However, those of skill will understand the utility of such allocations when implementing service schedules and procedures, and when determining cooling and power requirements, for example.

Figure 18:
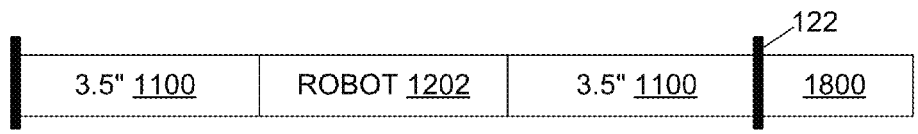
FIG. 18 is a sectional view diagram illustrating an arrangement with 3.5 inch hard disk drives and a robotic servicing plenum in a rack.
Figure 19:
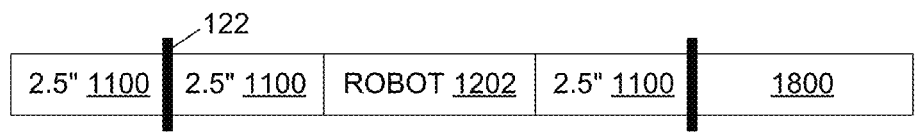
FIG. 19 is a sectional view diagram illustrating an arrangement with 2.5 inch hard disk drives and a robotic servicing plenum in a rack.

With the foregoing in mind, FIG. 18 illustrates space allocations in an arrangement with two columns of 3.5 inch hard disk drives and a robotic servicing plenum. FIG. 19 illustrates allocations in an arrangement with three 2.5 inch hard disk drive columns and one robotic servicing plenum. The drive columns adjacent the plenum can be serviced via the plenum, while the leftmost column can be serviced through the rack's left side. Accordingly, one double-sided or two single-sided system boards would be positioned between the two leftmost drive columns, as indicated. To be disconnected, drives in the leftmost column would be pulled leftward into the space between racks, while drives in the next column to the right would be disconnected by being pulled rightward into the robotic service plenum 1202.

Figure 20:
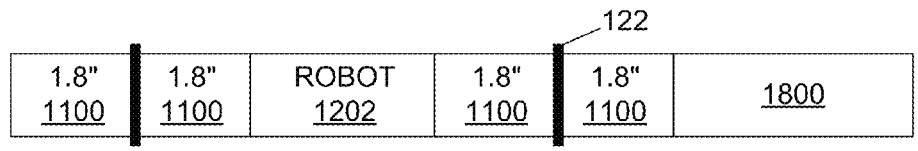
FIG. 20 is a sectional view diagram illustrating an arrangement with 1.8 inch hard disk drives and a robotic servicing plenum in a rack.
Figure 21:
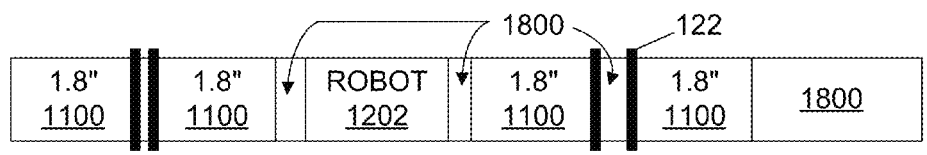
FIG. 21 is a sectional view diagram illustrating another arrangement with 1.8 inch hard disk drives and a robotic servicing plenum in a rack.
Figure 22:
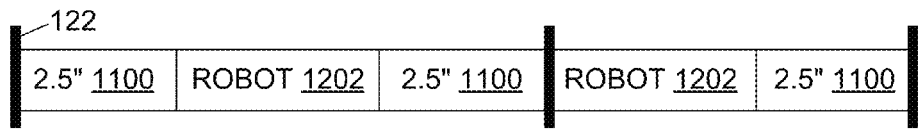
FIG. 22 is a sectional view diagram illustrating an arrangement with 2.5 inch hard disk drives and two robotic servicing plenums in a rack.

FIG. 20 illustrates allocations in an arrangement with four columns of 1.8 inch hard disk drives and one robotic servicing plenum. FIG. 21 illustrates allocations in another arrangement with four columns of 1.8 inch hard disk drives and one robotic servicing plenum. Note in particular that a space between drive columns may be larger or smaller than a servicing plenum width, in addition to having the same width, depending on the embodiment. FIG. 22 illustrates allocations in another arrangement with three columns of 2.5 inch hard disk drives, this time with two robotic servicing plenums.

With the foregoing in mind, some embodiments provide or use a device rack 108 which includes a rack frame 110 including posts 112 having exterior surfaces 300 which define a rack frame interior 200. At least one system board 122 is located at least partially within the rack frame interior. At least one hundred electronic device connectors 124 are also part of the rack, each electronic device connector having a system board portion 502 and an electronic device portion 504. The system board portion is mechanically secured to at least one system board. The electronic device portion is mechanically and electronically releasably connectable to at least one electronic device. In this embodiment, the system board or boards 122 is/are fixed in position relative to the posts, e.g., they are not on sliding rails 900.

Some embodiments provide or use a rack 108 wherein a system board 122 is "substantially vertical", namely, a geometric plane 602 that bisects the system board is positioned within five degrees of being vertical. In some, a connector density within the rack frame interior 200 is also at least 400 mechanically and electronically releasably connectable electronic device connectors per cubic meter. In some, the connector density is at least 600, or at least 800, or at least 1000, and so on, up to and including embodiments in which connector density is at least 4000.

Embodiments do not necessarily include connected electronic devices 128, but some embodiments do provide or use a rack 108 in which multiple electronic devices are releasably connected mechanically and electronically with respective electronic device connectors 124. In some, the rack frame interior 200 is also devoid of any sliding rail 900 which moves one or more of the connected electronic devices out of the rack frame interior 200. In some, the rack frame interior 200 is devoid of any cable management device, such as a cable management arm 1000 or cable spool, with cabling to the connected electronic devices 128.

In some embodiments, at least three hundred electronic devices 128 are releasably connected mechanically and electronically with respective electronic device connectors 124. In some, a plenum 1202 within the rack frame interior 200 is defined at least in part by virtue of bordering electronic devices 128, electronic device connectors 124, and at least one system board 122. In some, the plenum is "substantially vertical", namely, a geometric plane 1204 that bisects the plenum 1202 is positioned within five degrees of being vertical.

In some embodiments, the electronic devices 128 include a first column 1200 of electronic devices that are releasably connected mechanically and electronically to a first system board 122 through respective first board electronic device connectors and the electronic devices also include a second column 1200 of electronic devices that are releasably connected mechanically and electronically to a second system board 122 through respective second board electronic device connectors. The geometric plane 1204 that bisects the plenum is located "between the two columns", meaning that a majority of the plane within the interior 200 does not intersect hardware but instead lies within an air space. As used herein with regard to devices and connectors, "respective" permits a one-to-one, one-to-many, or many-to-one relationship but requires physical contact for a connection.

Some embodiments use or provide a device rack 108 wherein a connector density within the rack frame interior is at least a specified number (and/or or in a specified range) of mechanically and electronically releasably connectable electronic device connectors per cubic meter. Examples of minimal connector density values, and of connector density value ranges, are given elsewhere herein.

Some embodiments use or provide a device rack 108 wherein the rack frame interior has a volume that is within five percent in each dimension of a standard or commonly used volume. For example, some racks are within five percent in each dimension of at least one of the following commonly used volumes: a volume 600 mm deep 42 U high 19" wide, a volume 800 mm deep 42 U high 19" wide, a volume 1000 mm deep 42 U high 19" wide, a volume 1200 mm deep 42 U high 19" wide, a volume 600 mm deep 48 U high 19" wide, a volume 800 mm deep 48 U high 19" wide, a volume 1000 mm deep 48 U high 19" wide, or a volume 1200 mm deep 48 U high 19" wide. In some embodiments, other heights are used, e.g., 52 U, 56 U, 12 U, and so on.

Some embodiments use or provide a device rack 108 including a rack frame 110 which includes posts 112 having exterior surfaces 300 which define a rack frame interior 200; at least one system board 122 having a connector surface 500, with at least three-quarters of the connector surface being located within the rack frame interior; and at least two hundred electronic device connectors 124, each electronic device connector having a system board portion 502 and an electronic device portion 504, the system board portion being mechanically secured to at least one system board connector surface within the rack frame interior, the electronic device portion being mechanically and electronically releasably connectable to at least one electronic device. In some, the device rack is further characterized in at least one of the following ways: (a) the rack frame interior 200 is devoid of any sliding rails 900 which collectively move at least ten percent of the electronic device connectors out of the rack frame interior, or (b) the rack frame interior is devoid of any hinged cable management arm 1000. In some embodiments, the device rack is characterized in both listed ways, namely, (a) the rack frame interior is devoid of any sliding rails which collectively move at least ten percent of the electronic device connectors out of the rack frame interior, and also (b) the rack frame interior is devoid of any hinged cable management arm.

Some embodiments further include at least two hundred electronic devices 128, each of which is releasably mechanically and electrically connected to at least one of the electronic device connectors. In some, a plenum 1202 within the rack frame interior 200 is defined at least in part by virtue of bordering electronic devices 128, electronic device connectors 124, and at least one system board 122. In some of these, the plenum 1202 has a volume which is between one-third and two-thirds of the rack frame interior 200 volume.

Some embodiments include at least three system boards 122. In some, each of these system boards (although not necessarily every system board 122 in the interior 200) is substantially vertical (as defined elsewhere herein; see, e.g., FIGS. 6 and 7) and is also fixed in position relative to the posts 112. In some, the system boards collectively have at least three hundred electronic device connectors located within the rack frame interior. In some, a first plenum 1202 and a second plenum 1202 within the rack frame interior are each defined at least in part by bordering at least a hundred adjacent electronic devices, at least a hundred electronic device connectors, and at least two system boards, and each plenum is substantially vertical (as defined elsewhere herein; see, e.g., FIG. 12 for one substantially vertical plenum and FIG. 22 for two plenums). In some, the plenums collectively have a volume which is between one-third and two-thirds of the rack frame interior volume.

Some embodiments use or provide an array of at least seven device racks; see, e.g., FIGS. 13 through 15. To clarify the relative positioning of the constituent racks of an array, the array may be viewed as having a reference device rack with at least three other racks on each side, wherein each device rack has a front and two sides, and wherein the fronts of the racks are aligned within one inch (or other specified distance under a cut-off, e.g., 12 inches) of a vertical plane 1308 through the front of the reference device rack. In some embodiments, a connector density within each rack frame interior is at least 700 (or another minimum, or within a range noted herein) number of mechanically and electronically releasably connectable electronic device connectors per cubic meter. In some, the array is further characterized in at least one of the following ways: a gap of at least 400 mm (400 millimeters) exists between any sides of any two of the racks (e.g., per FIG. 13), or each rack has a side that is within 10 mm of a side of another of the racks (e.g., per FIGS. 14 and 15). In some embodiments, the side gap is at least 600 mm. In some it is between 500 and 700 mm.

Processes (a.k.a. Methods)

Figure 23:
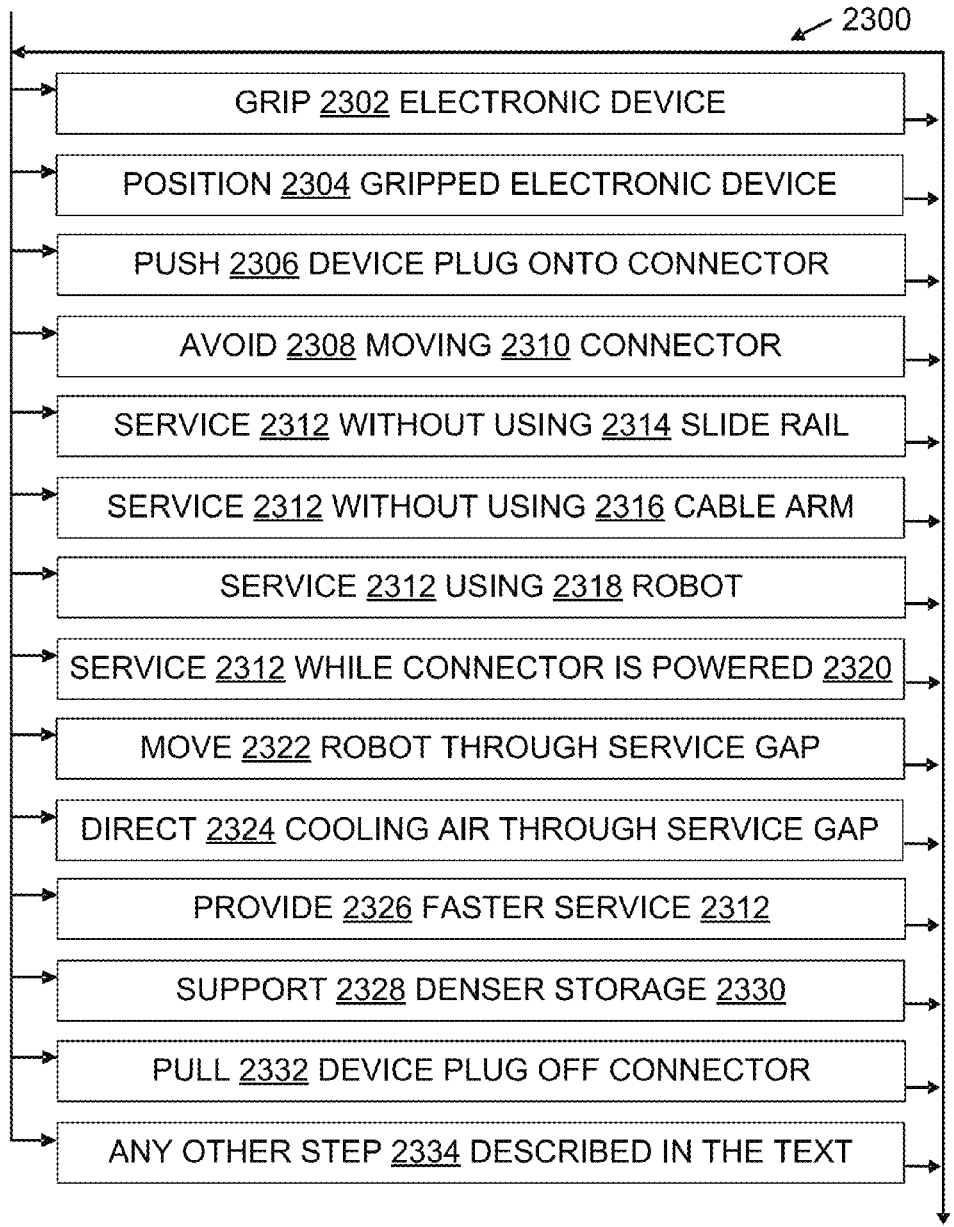
FIG. 23 is a flow chart illustrating aspects of some rack servicing methods.

FIG. 23 illustrates some process embodiments in a flowchart 2300. Technical processes shown in the Figures or otherwise disclosed may be performed in some embodiments automatically, e.g., by a robot under the control of software code. Processes may also be performed in part automatically and in part manually unless otherwise indicated. In a given embodiment zero or more illustrated steps of a process may be repeated, perhaps with different parameters or data to operate on. Steps in an embodiment may also be done in a different order than the top-to-bottom order that is laid out in FIG. 23. Steps may be performed serially, in a partially overlapping manner, or fully in parallel. The order in which flowchart 2300 is traversed to indicate the steps performed during a process may vary from one performance of the process to another performance of the process. The flowchart traversal order may also vary from one process embodiment to another process embodiment. Steps may also be omitted, combined, renamed, regrouped, or otherwise depart from the illustrated flow, provided that the process performed is operable and conforms to at least one claim.

Examples are provided herein to help illustrate aspects of the technology, but the examples given within this document do not describe all possible embodiments. Embodiments are not limited to the specific arrangements, device counts, column counts, layer counts, storage devices, materials, implementations, arrangements, figures, features, approaches, or scenarios provided herein. A given embodiment may include additional or different technical features, mechanisms, and/or steps, for instance, and may otherwise depart from the examples provided herein.

Some embodiments include or use a device rack servicing method which includes gripping 2302 an electronic device 128, either in a robot gripper or by a human hand or a manual hand tool, for example. The electronic device 128 has a plug 1108 containing at least one power line and at least one data signal line (not shown). This rack servicing method also includes positioning 2304 the gripped electronic device until it is within 25 mm of a matching connector 124 on a system board 122 which is stationed within a rack frame interior 200 that is defined by exterior surfaces 300 of posts 112 of a rack frame 110. For example, positioning may be accomplished using 2318 robotic servos, proximity sensors, numeric control, and/or other mechanisms. In particular, positioning mechanisms and techniques employed by automated tape libraries (a.k.a., tape jukeboxes) may be adapted by one of skill for use 2318 in servicing racks taught herein. This rack servicing method also includes pushing 2306 the plug of the gripped electronic device onto the matching connector until the plug and the connector are releasably mechanically connected. The gripped electronic device and the connector will also be releasably electronically connected by the pushing 2306, through contact of the plug 1108 with the connector's pins and/or sockets.

In some embodiments, the servicing method includes moving 2310 the connector 124 relative to the rack frame posts during the positioning 2304 and/or pushing 2306 steps. But in other embodiments, the servicing method avoids 2308 moving the connector relative to the rack frame posts during the positioning and pushing.

In particular, some methods accomplish positioning 2304 and pushing 2306 (collectively, servicing 2312, also referred to as placing 2312) without using 2314 a slide rail 900 and without using 2316 a cable management arm 1000 or other cable management mechanism that is secured to the rack being serviced. Note that a robot's own rail and/or a robot's own cable management mechanism may still be used. That is, some methods place 2312 the electronic device in service without moving any sliding rail 900 of the rack within the rack frame interior. Some methods place 2312 the electronic device in service without moving any hinged cable management arm of the rack 108 within the rack frame interior unless the arm is one that carries a signal to a robot 1600 which performs the gripping, as opposed to one that manages a cable to a gripped electronic device 128.

In some embodiments, the gripping 2302, positioning 2304, and pushing 2306 are performed by a robot 1600 within a rack frame interior 200 that has a connector density of at least 1200. One of skill will understand that the "connector density" is a value defined herein and calculated as the number of mechanically and electronically releasably connectable electronic device connectors 124 per cubic meter of rack interior space. More generally, various embodiments have connector densities of at least 200, 300, 400, 500, 600, 700, 800, 900, 1000, 1100, 1200, 1300, 1400, 1500, 1600, 1700, 1800, 1900, 2000, 2100, 2200, 2300, 2400, 2500, 2600, 2700, 2800, 2900, or 3000, respectively. Each of these values may also serve as a cap, e.g., in some embodiments the connector density is no greater than 3000, 2900, 2800, etc. Each pair of values also defines a range, e.g., in some embodiments the connector density is 500 to 1500, or 400 to 1200, or 900 to 1700, and so on.

In some embodiments, the method provides hot-plug servicing 2312, namely, the pushing 2306 is performed while the system board 122 (and in particular the connector 124 in question) is electrically powered 2320. The plug and the connector are releasably mechanically and electrically connected with one another after the pushing 2306.

In some embodiments, the positioning 2304 includes moving 2322 (via robotic action) the gripped electronic device from a position entirely outside the rack frame interior 200, through a service gap 1202 within the rack frame interior in between at least two system boards 122 which are both stationed within the rack frame interior, to reach the position within 25 mm of the matching connector.

Some methods include directing 2324 cooling air through a service gap 1202 toward at least five hundred (or 600, or 700, etc., through at least 3000) hot-pluggable electronic storage devices 128 which are plugged into electronic device connectors 124 within the rack frame interior 200.

In some embodiments, the gripping, positioning, and pushing are performed by a robot while the system board is electrically powered. In some, the plug and the connector are releasably mechanically and electrically connected with one another after the pushing, and the connector is one of at least one thousand hot-pluggable storage device connectors within the rack frame interior. In some embodiments, the gripping, positioning, and pushing as performed by a robot cause provide 2326 faster service 2312, in the sense that robotic servicing 2312 results in less operational downtime of the connector 124 than gripping, positioning, and pushing performed by a human service technician would require.

In some embodiments, the system board is one of a plurality of system boards located within the rack frame interior, and the system boards collectively carry at least eight hundred (or 900, or 1000, etc., up to at least 3000) electronic storage device connectors which are mechanically and electrically connected to respective powered electronic storage devices. In some, the method further includes gripping 2302 another one of the electronic storage devices with a service robot gripper, and robotically pulling 2332 the gripped electronic storage device away from the respective electronic storage device connector, thereby mechanically and electrically disconnecting the electronic storage device from one of the system boards. This method may also include robotically moving 2322 the disconnected electronic storage device to a position outside the rack frame interior. Any other step 2334 described in the text of the present disclosure may also be part of a process or method embodiment.

Some Additional Combinations and Variations

Some embodiments provide or use an ultra-high density low cost storage rack solution that fits into a standard data center height rack (up to 52 RU). Leveraging today's commodity 3.5" hard disk drive (HDD) as the storage media, a single rack solution allows for at least 1400 3.5" HDDs or at least 11.2 petabytes of storage, while having low overhead cost per HDD, e.g., with 8 terabyte HDDs.

One of the features of some solutions is that all HDDs are individually hot-pluggable in a datacenter or other facility's cold aisle without the need to open enclosures, remove trays, or slide any mechanical contraptions. Accordingly, each of the 1400 or more HDDs can be removed, replaced, and serviced individually with relatively little effort while the solution is still powered-on. This allows the solution to be upgraded in future to have automated robots that will conduct HDD replacement and installation operations typically done by more costly service and repair data center technicians. This feature can be accomplished by having the HDDs be accessible from both sides of the racks instead of just the front or rear per a typical storage server and rack solution. By having the HDDs be accessible on both the right and left sides of the rack, an embodiment increases the access surface area by more than 400% over what's typical today. In addition, by scaling out this solution to be rack level, power, cooling, and mechanicals are distributed at the same larger scale, thus allowing for operational and capital expenditure to be dramatically reduced. This allows for an ultra-low cost solution, which can be the lowest cost per gigabyte storage solution with hot-pluggable storage media.

Some embodiments include one or more of the following hardware components.

Semi-custom rack. Consistent with the teachings herein and skill in the art, a rack frame 110 can be designed. The overall form factor of the rack can be similar to standard EIA 310-D, but it will not necessarily follow the specification exactly. It may have different structural cross bars to support a high-density solution and provide left and right side accessibility.

PCBA. Consistent with the teachings herein and skill in the art, boards may be developed to mate with the HDDs, to house a fabric controller, and/or to allow internal or external connectivity.

Cooling solution. For a given configuration, familiar principles can be applied to create a cooling solution, based on the requirements of connected devices 128 and the plenum 1202 size and shape, for example.

Robots. A mechanical serviceable robot 1600 can be designed for a given implementation, consistent with the teachings herein and skill in the art. Includes associated mounting and motor components. As noted, tape library robots may be adapted for use with innovative racks 108. Storage capacity provided currently by tape library datacenters could be provided instead by embodiments taught herein.

Some embodiments include HDD 128 which are hot-pluggable and accessed from the left and right side of the rack, instead of the front or rear. This allows for a 400% or more increase in access surface area, and allows 2328 for more than 1400 3.5" HDDs to be hot-plugging in the cold aisle without complicated mechanical contraptions. Some embodiments support automated robots to do the installation and repair operations instead of costly manual service technicians. In some embodiments, storage racks are deployed in single rack footprints and with spacing between racks to allow for serviceability from both sides.

In some embodiments, power and cooling is present in the rack(s) for at least 25% of the connectors 124 at a time. In some, the threshold is at least 50%, in some it is at least 75%, and in some embodiments, power and cooling is present in the rack(s) for all of the connectors 124 at a given time. This contrasts with solutions that only support use of a fraction of connected HDDs at one time, for instance.

Some embodiments may be described using a release direction vector. Each electronic device connector 124 can be viewed as having an electronic device release direction, which is a geometric unit vector oriented within five degrees of normal to the system board plane 602. The release direction vector indicates a direction of travel for an electronic device 128 when the electronic device is mechanically and electrically released from engagement with the electronic device connector, e.g., when a technician or robot pulls a hard drive off the system board. If the release direction vector is horizontal, for instance, then the hard drive 128 travels more or less parallel to the floor when being disconnected. An embodiment may have one or more specified release direction vectors for its connectors 124, which may be any specified direction.

In some embodiments, the electronic device release directions of the electronic device connectors point from the electronic device connectors into a cooling plenum 1202 within the rack frame interior and/or point into a space 1302 between racks. In FIGS. 18 through 22, release direction vectors point away from boards 122 into air, either into a plenum 1202 or into a space on the left or right side of the diagrams. Thus, a device 128 may be unplugged by pulling it into a plenum or into a space on the side of a rack.

Some embodiments use or provide 2328 a high density JBOD 2330 with individual HDD repair online (e.g., hot-plug) that does not require mechanically moving assemblies for repair. In some, every HDD receives inlet air instead of preheated air for cooling (unlike normal JBOD designs), thus significantly improving reliability. Some embodiments have rack form factors that match existing datacenter rack standards. Some can be designed for either human repair (in a wider version) or robots (in a tighter version). In some, the density 2330 is at least 40 HDD deep per layer, with 16 layers, yielding at least 640 HDDs per side and at least 1280 HDDs per 48 U rack, based roughly on dimensions of conventional JBODs.

Some embodiments use or provide a sidewall accessible device rack 108, including a rack frame 110 having an exterior 202 and an interior 200. The rack frame exterior and rack frame interior each have a respective width, depth, height, front, rear, left side, and right side. The rack frame includes at least four parallel vertical posts. The posts include a front left post, a rear left post, front right post, and a rear right post. The rack frame also includes a left crossbar structure attached to the front left post and the rear left post, and a right crossbar structure attached to the front right post and the rear right post. A left printed circuit board assembly (left PCBA) 122 plus 124 is secured relative to the front left post and the rear left post, with the left PCBA closer to the rack frame exterior left side than it is to the rack frame exterior right side. The left PCBA is configured to releasably engage mechanically and electronically with each of a first plurality of electronic devices 128 within the rack frame interior. A right PCBA 122 plus 124 is secured relative to the front right post and the rear right post, with the right PCBA closer to the rack frame exterior right side than it is to the rack frame exterior left side. The right PCBA is configured to releasably engage mechanically and electronically with each of a second plurality of electronic devices within the rack frame interior.

In some examples, each of the PCBAs is configured to releasably engage mechanically and electronically each of a respective plurality of electronic devices 128 which includes at least one of the following: a hot-pluggable hard disk drive, or a dual in-line memory module.

In some examples, each of the PCBAs is engaged mechanically and electronically with a respective plurality of engaged electronic devices 128 each of which extends from the respective PCBA into the rack frame interior a respective engaged extent, and a servicing gap 1800 is present within the rack frame interior between the respective pluralities of electronic devices. The servicing gap includes a functionally empty volume 1202 which is (a) at least as wide as the largest of any of the electronic device engaged extents, (b) at least as deep as half of the rack frame interior depth, and (c) at least as high as half of the rack frame interior height.

In some examples, each of the PCBAs is engaged mechanically and electronically with a respective plurality of engaged extent electronic devices 128 each of which extends from the respective PCBA into the rack frame interior, and the rack frame interior is devoid of any sliding rail 900 configured to extend one or more of the engaged extent electronic devices from the front of the sidewall accessible device rack.

In some examples, the sidewall accessible device rack exterior width at the rack frame front is one of the following: 19 inches (482.6 mm), or 22.83 inches (580 mm).

In some examples, use of the rack 108 allows avoidance of one or more of the following: keeping some of the hard disks in the rack powered down, using rails 900, using cable management arms 1000, using drives that are not hot-pluggable, using more cold air than the implementation uses, using a lower density of storage devices than the implementation uses, using storage devices that emit less heat tan the devices 128.

Any of these combinations of layers, counts, devices, sizes, shapes, device counts, distances, density values, hardware components, relative positions, thresholds, configurations and/or their functional equivalents may also be combined with any of the racks or rack components and their variations described above. A process of making or using a rack may include any steps described herein in any subset or combination or sequence which is operable. Each variant may occur alone, or in combination with any one or more of the other variants. Each variant may occur with any of the processes and each process may be combined with any one or more of the other processes.

Conclusion

Although particular embodiments of tools and techniques for airflow control patterns for cooling multiple in-line objects, for example, are expressly illustrated and described herein as processes, devices, or systems, it will be appreciated that discussion of one type of embodiment also generally extends to other embodiment types. For instance, the descriptions of processes in connection with FIG. 23 also help describe racks, and help describe the technical effects and operation of systems and manufactures like those discussed in connection with other Figures. It does not follow that limitations from one embodiment are necessarily read into another. In particular, processes and racks are not necessarily limited to the numbers, orderings, shapes and arrangements presented as examples.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "process, system, article of manufacture, and/or other example of the teachings herein as applied in a manner consistent with applicable law." Accordingly, a given "embodiment" may include any combination of features disclosed herein, provided the embodiment is consistent with at least one claim.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways in a given implementation without necessarily omitting desired technical effects from the collection of interacting modules viewed as a whole.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims and the abstract, as filed, are part of the specification.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A device rack, comprising:
   a rack frame including posts having exterior surfaces which define a rack frame interior;
   at least one system board mechanically fixed in position relative to the posts, the at least one system board having a connector surface, at least three-quarters of the connector surface being located within the rack frame interior;

at least two hundred electronic device connectors, each electronic device connector having a system board portion and an electronic device portion, the system board portion being mechanically secured to at least one system board connector surface within the rack frame interior, the electronic device portion being mechanically and electronically releasably connectable to at least one electronic device; and wherein the device rack is further characterized in at least one of the following ways: (a) the rack frame interior is devoid of any sliding rails which collectively move at least ten percent of the electronic device connectors out of the rack frame interior at one time, or (b) the rack frame interior is devoid of any hinged cable management arm directly attached to the rack frame, and wherein the at least one system board includes three system boards, each of which is substantially vertical and is mechanically fixed in position relative to the posts, the system boards collectively having at least three hundred electronic device connectors located within the rack frame interior, and wherein a first plenum and a second plenum within the rack frame interior are each defined at least in part by bordering at least a hundred adjacent electronic devices, at least a hundred electronic device connectors, and at least two system boards, each plenum being substantially vertical, the plenums collectively having a volume which is between one-third and two-thirds of the rack frame interior volume.

2. The device rack of claim 1, wherein the device rack is characterized in both listed ways, namely, (a) and also (b).

3. The device rack of claim 1, further comprising at least two hundred electronic devices, each of which is releasably mechanically and electrically connected to at least one of the electronic device connectors, and wherein a plenum within the rack frame interior is defined at least in part by virtue of bordering electronic devices, electronic device connectors, and at least one system board, the plenum having a volume which is between one-third and two-thirds of the rack frame interior volume.

4. An array of at least seven device racks according to claim 1, including a reference device rack with at least three other racks on each side, wherein each device rack has a front and two sides, wherein the fronts of the racks are aligned within one inch of a vertical plane through the front of the reference device rack, wherein a connector density within each rack frame interior is at least 700 mechanically and electronically releasably connectable electronic device connectors per cubic meter, and wherein the array is further characterized in at least one of the following ways:

a gap of at least 400 mm exists between any sides of any two of the racks; or each rack has a side that is within 10 mm of a side of another of the racks.

5. A device rack servicing method, comprising:
gripping an electronic device which has a plug containing at least one power line and at least one data signal line;
positioning the gripped electronic device until it is within 25 mm of a matching connector on a system board which is mechanically fixed in position within a rack frame interior that is defined by exterior surfaces of posts of a rack frame, wherein positioning the gripped electronic device includes moving the gripped electronic device from a position entirely outside the rack frame interior, through a service gap within the rack frame interior in between at least two system boards which are both stationed within the rack frame interior, to the position within 25 mm of the matching connector;

pushing the plug of the gripped electronic device onto the matching connector until the plug and the connector are releasably mechanically connected; and avoiding moving the connector relative to the rack frame posts during said positioning and pushing.

6. The method of claim 5, further comprising at least one of the following:

placing the electronic device in service without moving any sliding rail within the rack frame interior;

placing the electronic device in service without moving any hinged cable management arm within the rack frame interior unless the arm carries a signal to a robot which performs said gripping.

7. The method of claim 5, wherein said gripping, positioning, and pushing are performed by a robot within a rack frame interior that has a connector density of at least 1200 mechanically and electronically releasably connectable electronic device connectors per cubic meter.

8. The method of claim 5, wherein the method provides hot-plug servicing, namely, said pushing is performed while the system board is electrically powered, and wherein the plug and the connector are releasably mechanically and electrically connected with one another after the pushing.

9. The method of claim 5, further comprising directing cooling air through the service gap toward at least five hundred hot-pluggable electronic storage devices which are plugged into electronic device connectors within the rack frame interior.

10. The method of claim 5, wherein the gripping, positioning, and pushing are performed by a robot while the system board is electrically powered, the plug and the connector are releasably mechanically and electrically connected with one another after the pushing, the connector is one of at least one thousand hot-pluggable storage device connectors within the rack frame interior, and the gripping, positioning, and pushing as performed by a robot cause less operational downtime of the connector than gripping, positioning, and pushing performed by a human would require.

11. The method of claim 5, wherein the system board is one of a plurality of system boards located within the rack frame interior, the system boards collectively carry at least eight hundred electronic storage device connectors which are mechanically and electrically connected to respective powered electronic storage devices, and the method further comprises:

gripping one of the electronic storage devices with a service robot gripper;

robotically pulling the gripped electronic storage device away from the respective electronic storage device connector, thereby mechanically and electrically disconnecting the electronic storage device from one of the system boards; and robotically moving the disconnected electronic storage device to a position outside the rack frame interior.

* * * * *